(12) United States Patent
Takenaka

(10) Patent No.: US 11,309,844 B2
(45) Date of Patent: *Apr. 19, 2022

(54) POWER AMPLIFIER

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/931,965

(22) Filed: Jul. 17, 2020

(65) Prior Publication Data

US 2020/0350867 A1    Nov. 5, 2020

Related U.S. Application Data

(63) Continuation of application No. 16/104,305, filed on Aug. 17, 2018, now Pat. No. 10,742,172, which is a
(Continued)

(30) Foreign Application Priority Data

Feb. 17, 2016 (JP) .............................. JP2016-028325

(51) Int. Cl.
*H03F 3/68* (2006.01)
*H03F 1/02* (2006.01)
(Continued)

(52) U.S. Cl.
CPC ........... *H03F 1/0288* (2013.01); *H03F 3/195* (2013.01); *H03F 3/211* (2013.01); *H03F 3/213* (2013.01);
(Continued)

(58) Field of Classification Search
CPC ........ H03F 1/0288; H03F 3/195; H03F 3/211; H03F 3/213; H03F 2200/297;
(Continued)

(56) References Cited

U.S. PATENT DOCUMENTS 5,568,086 A    10/1996  Schuss et al.
6,392,491 B1    5/2002  Ohkawa et al.
(Continued)

FOREIGN PATENT DOCUMENTS

CN    101467346 A    6/2009
CN    105322893 A    2/2016
(Continued)

OTHER PUBLICATIONS

International Search Report for International Application No. PCT/JP2016/063475 dated Jul. 26, 2016.
Written Opinion for International Application No. PCT/JP2016/063475 dated Jul. 26, 2016.

*Primary Examiner* — Khanh V Nguyen
(74) *Attorney, Agent, or Firm* — Pearne & Gordon LLP

(57) ABSTRACT

A power amplifier includes a power splitter that splits a first signal into a second signal and a third signal, a first amplifier that amplifies the second signal within an area where the first signal has a power level greater than or equal to a first level and that outputs a fourth signal, a second amplifier that amplifies the third signal within an area where the first signal has a power level greater than or equal to a second level higher than the first level and that outputs a fifth signal, an output unit that outputs an amplified signal of the first signal, a first and a second LC parallel resonant circuit, and a choke inductor having an end to which a power supply voltage is supplied and another end connected to a node of the first and second LC parallel resonant circuits.

11 Claims, 17 Drawing Sheets

Related U.S. Application Data continuation of application No. PCT/JP2016/063475, filed on Apr. 28, 2016.

(51) Int. Cl.
    *H03F 3/195*           (2006.01)
    *H03F 3/21*             (2006.01)
    *H03F 3/213*           (2006.01)

(52) U.S. Cl.
    CPC .. *H03F 2200/297* (2013.01); *H03F 2200/301* (2013.01); *H03F 2200/309* (2013.01); *H03F 2200/336* (2013.01); *H03F 2200/387* (2013.01); *H03F 2200/451* (2013.01); *H03F 2203/21139* (2013.01); *H03F 2203/21142* (2013.01); *H03F 2203/21169* (2013.01)

(58) Field of Classification Search
    CPC ......... H03F 2200/301; H03F 2200/309; H03F 2200/336; H03F 2200/387; H03F 2200/451; H03F 2203/21139; H03F 2203/21142; H03F 2203/21169
    USPC .............................................. 330/124 R, 295
    See application file for complete search history.

(56) References Cited

U.S. PATENT DOCUMENTS

| | | | |
|---|---|---|---|
| 7,800,448 B2* | 9/2010 | Blednov | ............... H03F 1/0288 330/295 |
| 7,907,009 B2* | 3/2011 | Mori | ......................... H03F 3/72 330/124 R |
| 8,659,359 B2 | 2/2014 | Ladhani et al. | |
| 9,300,254 B2* | 3/2016 | Shah | ....................... H03F 1/565 |
| 9,660,591 B2 | 5/2017 | Takenaka | |
| 2009/0273398 A1 | 11/2009 | Yu | |
| 2016/0013761 A1 | 1/2016 | Takenaka | |

FOREIGN PATENT DOCUMENTS

| | | |
|---|---|---|
| JP | H08-330873 A | 12/1996 |
| JP | H09-289421 A | 11/1997 |
| JP | H11-220337 A | 8/1999 |
| JP | 2012-199746 A | 10/2012 |
| JP | 2016-019228 A | 2/2016 |
| WO | 2008/062371 A2 | 5/2008 |
| WO | 2009/027916 A2 | 3/2009 |

\* cited by examiner

POWER AMPLIFIER

This is a continuation of U.S. patent application Ser. No. 16/104,305, filed on Aug. 17, 2018, which is a continuation of International Application No. PCT/JP2016/063475 filed on Apr. 28, 2016, which claims priority from Japanese Patent Application No. 2016-028325 filed on Feb. 17, 2016. The contents of these applications are incorporated herein by reference in their entireties.

BACKGROUND

Technical Field

The present disclosure relates to a power amplifier.

Background Art

Doherty amplifiers are known as high-efficiency power amplifiers (power amps) (for example, Patent Document 1). As disclosed in Patent Document 1, a Doherty amplifier has a configuration in which a carrier amplifier that operates regardless of the power level of an input signal and a peak amplifier that is turned off when the power level of an input signal is low and that operates when the power level is high are connected in parallel.

Patent Document 1: Japanese Unexamined Patent Application Publication No. 8-330873

BRIEF SUMMARY

As described above, Doherty amplifiers have attracted attention as high-efficiency power amplifiers. However, Doherty amplifiers, which include power amplifiers in two paths, require greater load impedance in each path and, in addition, require greater inductance of a choke inductor necessary as an amplifier circuit because of a greater number of power amplifiers. Thus, such Doherty amplifiers require a larger space for inductors than typical power amplifiers and thus are not suitable to be mounted on small electronic devices such as cellular phones.

The present disclosure has been made in view of the foregoing situation, and the present disclosure provides a power amplifier that can be made compact with high efficiency.

Solution to Problem

An power amplifier according to an aspect of the present disclosure includes a power splitter that splits a first signal into a second signal and a third signal that is delayed by approximately 90 degrees with respect to the second signal, a first amplifier that amplifies the second signal within an area where the first signal has a power level greater than or equal to a first level and that outputs a fourth signal, a second amplifier that amplifies the third signal within an area where the first signal has a power level greater than or equal to a second level higher than the first level and that outputs a fifth signal, an output circuit that outputs an amplified signal of the first signal on the basis of the fourth and fifth signals, a first and a second LC parallel resonant circuit connected in series between an output terminal of the first amplifier and an output terminal of the second amplifier, and a choke inductor having an end to which a power supply voltage is supplied and another end connected to a node of the first and second LC parallel resonant circuits, wherein the first LC parallel resonant circuit has a resonant frequency that is approximately an integer multiple of a frequency of the first signal, and the second LC parallel resonant circuit has a resonant frequency that is approximately an integer multiple of the frequency of the first signal.

Advantageous Effects of Disclosure

According to the present disclosure, it is possible to provide a power amplifier that can be made compact with high efficiency.

BRIEF DESCRIPTION OF THE SEVERAL VIEWS OF THE DRAWINGS

FIG. 4 is a diagram illustrating a state in which both the carrier amplifier and the peak amplifier are on.

DETAILED DESCRIPTION

An embodiment of the present disclosure will be described in detail hereinafter with reference to the drawings. The same elements are assigned the same numerals and are not described repeatedly.

Figure 1:
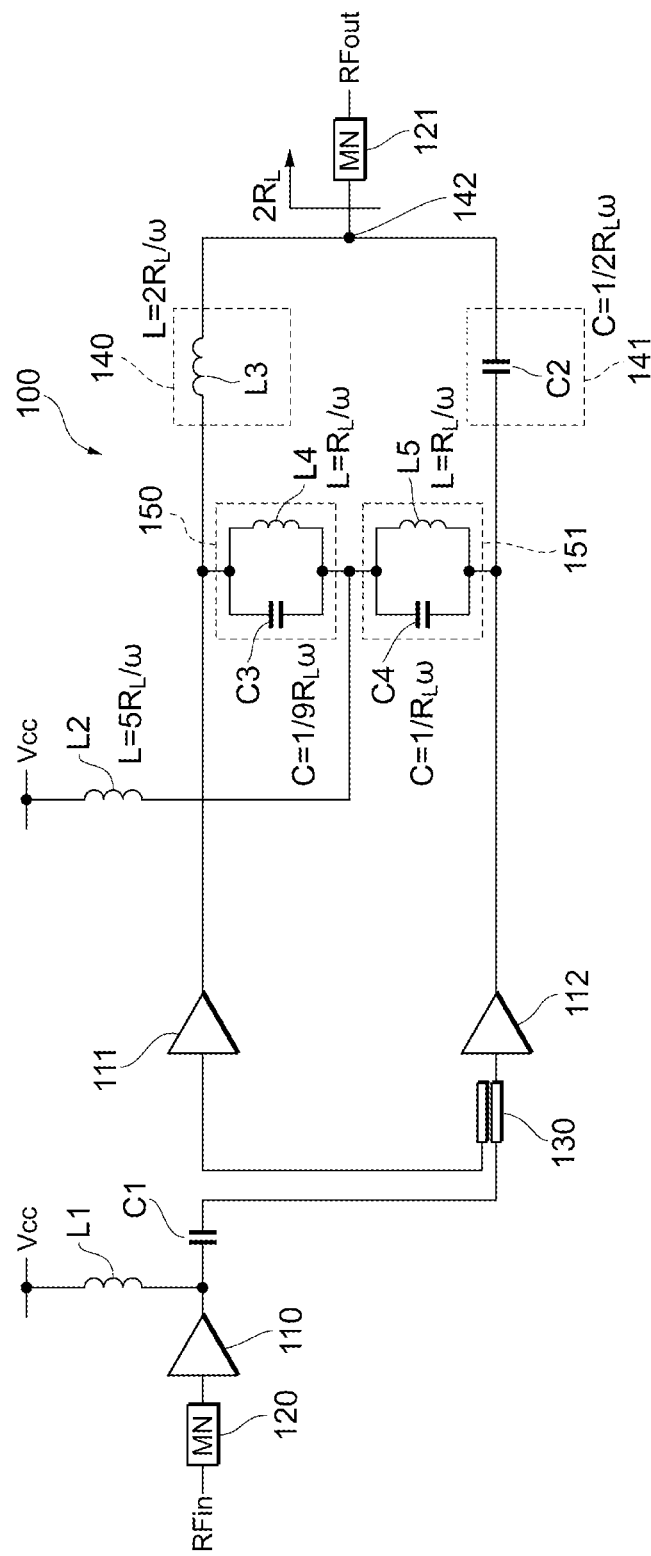
FIG. 1 is a diagram illustrating an example configuration of a power amplifier 100 according to an embodiment of the present disclosure.

FIG. 1 is a diagram illustrating an example configuration of a power amplifier 100 according to an embodiment of the present disclosure. The power amplifier 100 is mounted in, for example, a cellular phone and is used to amplify the power of a signal to be transmitted to a base station. The power amplifier 100 is capable of amplifying the power of signals of communication standards such as 2G (second generation mobile communication systems), 3G (third generation mobile communication systems), 4G (fourth generation mobile communication systems), 5G (fifth generation mobile communication systems), LTE (Long Term Evolution)-FDD (Frequency Division Duplex), LTE-TDD (Time Division Duplex), LTE-Advanced, and LTE-Advanced Pro. The communication standards for signals amplified by the power amplifier 100 are not limited to those described above.

The power amplifier 100 includes an initial-stage amplifier 110, a carrier amplifier 111, a peak amplifier 112, matching networks (MNs) 120 and 121, a coupled-line 3-dB coupler (hereinafter referred to simply as the "3-dB coupler") 130, phase shifters 140 and 141, a combiner 142, LC parallel resonant circuits 150 and 151, inductors L1 and L2, and a capacitor C1. The power amplifier 100 may be formed on the same substrate or may be formed on a plurality of substrates. Instead of a coupled-line 3-dB coupler, a lumped-constant circuit may be used to implement a 3-dB coupler.

The initial-stage amplifier 110 amplifies a radio-frequency (RF) signal RFin input through the matching network 120 and outputs an amplified signal (first signal). The signal RFin has a frequency of about several GHz, for example.

The inductors L1 and L2 suppress cross talk of a high-frequency signal from a signal line to a power supply. The inductor L1 has an end to which a power supply voltage Vcc is supplied and another end connected to an output terminal of the initial-stage amplifier 110. The inductor L2 (choke inductor) has an end to which the power supply voltage Vcc is supplied and another end connected to a node of the LC parallel resonant circuits 150 and 151. In this embodiment, the carrier amplifier 111 and the peak amplifier 112 share a power line, and thus a single choke inductor is required for the carrier amplifier 111 and the peak amplifier 112. The inductance of the inductor L2 will be described below.

The carrier amplifier 111, the peak amplifier 112, the 3-dB coupler 130, the phase shifters 140 and 141, and the combiner 142 constitute an amplifier circuit in the second stage that amplifies the signal (first signal) output from the initial-stage amplifier 110 and has a configuration similar to that of a typical Doherty amplifier.

The 3-dB coupler 130 (power splitter) splits the signal (first signal) output from the initial-stage amplifier 110 into a signal (second signal) to be directed to the carrier amplifier 111 and a signal (third signal) to be directed to the peak amplifier 112. The phase of the signal to be directed to the peak amplifier 112 is delayed by approximately 90 degrees with respect to the phase of the signal to be directed to the carrier amplifier 111.

The carrier amplifier 111 (first amplifier) amplifies the input signal (second signal) and outputs the amplified signal (fourth signal). The peak amplifier 112 (second amplifier) amplifies the input signal (third signal) and outputs the amplified signal (fifth signal).

Figure 2:
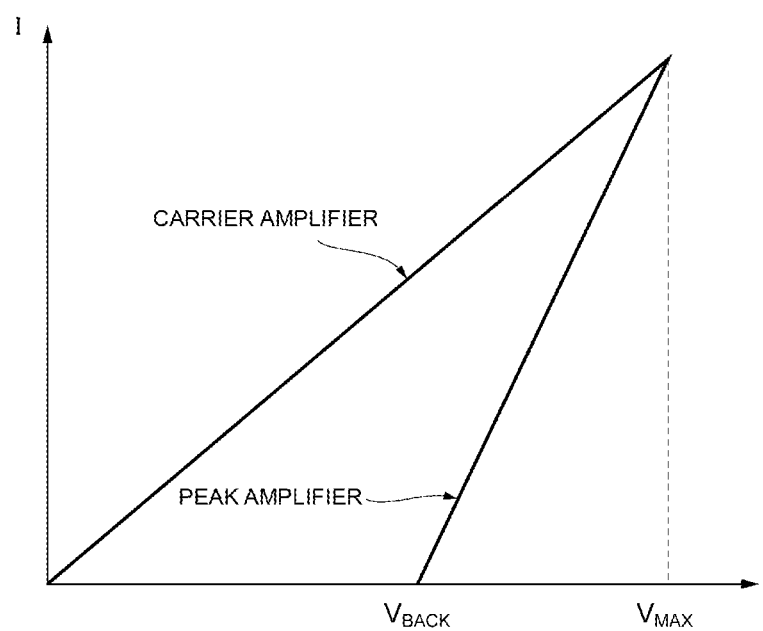
FIG. 2 is a diagram illustrating an example of the operational characteristics of a carrier amplifier and a peak amplifier.

FIG. 2 is a diagram illustrating an example of the operational characteristics of the carrier amplifier 111 and the peak amplifier 112. In FIG. 2, the horizontal axis represents the voltage of the signal RFin and the vertical axis represents the current in each amplifier. As illustrated in FIG. 2, the carrier amplifier 111 operates regardless of the voltage level of the signal RFin. That is, the carrier amplifier 111 operates regardless of the power level of the signal RFin (that is, within an area where the power level is greater than or equal to zero (first level)). On the other hand, the peak amplifier 112 operates within an area where the voltage level of the signal RFin is greater than or equal to a level $V_{BACK}$, which is lower than a maximum level $V_{MAX}$ by a predetermined level. That is, the peak amplifier 112 operates within an area where the power level of the signal RFin is greater than or equal to a level (second level) that is lower than the maximum level by the predetermined level (for example, about 6 dB) and that is higher than zero.

Referring back to FIG. 1, the phase shifters 140 and 141 and the combiner 142 constitute an output unit or circuit that outputs an amplified signal RFout of the signal RFin on the basis of the amplified signals output from the carrier amplifier 111 and the peak amplifier 112.

The phase shifter 140 (first phase shifter) includes an inductor L3 (series inductor) connected in series between the carrier amplifier 111 and the combiner 142. The phase shifter 140 outputs a signal (sixth signal) that is delayed in phase by approximately 45 degrees with respect to the signal (fourth signal) output from the carrier amplifier 111. In this embodiment, the inductance of the inductor L3 is set to $L=2R_L/\omega$. Here, $2R_L$ is the impedance on the matching network 121 side viewed from the combiner 142, and w denotes the angular frequency corresponding to the center frequency of the signal RFin.

The phase shifter 141 (second phase shifter) includes a capacitor C2 (series capacitor) connected in series between the peak amplifier 112 and the combiner 142. The phase shifter 141 outputs a signal (seventh signal) that is advanced in phase by approximately 45 degrees with respect to the signal (fifth signal) output from the peak amplifier 112. In this embodiment, the capacitance of the capacitor C2 is set to $C=1/(2R_L\omega)$. The principle of phase conversion in the phase shifters 140 and 141 will be described below.

The combiner 142 combines the signal (sixth signal) output from the phase shifter 140 and the signal (seventh signal) output from the phase shifter 141 to obtain a composite signal and outputs the composite signal through the matching network 121 as the amplified signal RFout of the signal RFin.

The LC parallel resonant circuits 150 and 151 are connected in series between an output terminal of the carrier amplifier 111 and an output terminal of the peak amplifier 112. The LC parallel resonant circuits 150 and 151 suppress cross talk of an amplified signal output from one amplifier toward the other path, which may be generated due to the sharing of the power line between the carrier amplifier 111 and the peak amplifier 112. The LC parallel resonant circuit 150 (first LC parallel resonant circuit) includes a capacitor C3 and an inductor L4 that are connected in parallel. The LC parallel resonant circuit 151 (second LC parallel resonant circuit) includes a capacitor C4 and an inductor L5 that are connected in parallel. In this embodiment, the capacitance of the capacitor C3 is set to $C=1/(9R_L\omega)$, the capacitance of the capacitor C4 is set to $C=1/(R_L\omega)$, and the inductances of the inductors L4 and L5 are both set to $L=R_L/\omega$. The operation of the LC parallel resonant circuits 150 and 151 will be described in detail below.

Next, the principle of phase conversion in the phase shifters 140 and 141 will be described with reference to FIG. 3 to FIG. 7. For convenience of illustration, in FIG. 3 to FIG. 7, phase shifters 140A and 141A are assumed as phase shifters. The phase shifter 140A includes, in addition to the configuration of the phase shifter 140, a capacitor C5 having an end electrically connected to the combiner 142 and another end grounded. The capacitance of the capacitor C5 is assumed to be set to $C=1/(4R_L\omega)$. The phase shifter 141A includes, in addition to the configuration of the phase shifter 141, an inductor L6 having an end electrically connected to the combiner 142 and another end grounded. The inductance of the inductor L6 is assumed to be set to $L=4R_L/\omega$. Referring to FIG. 3 to FIG. 7, the description is given, with the omission of the choke inductor for the carrier amplifier 111 and the peak amplifier 112.

Figure 3:
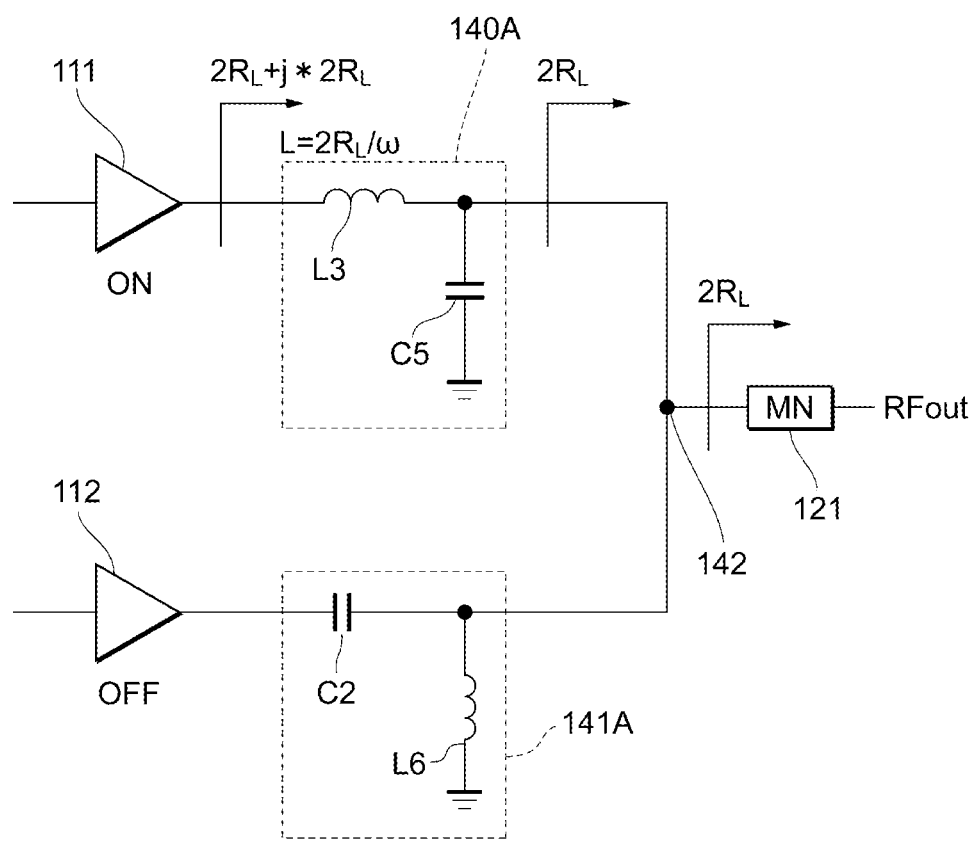
FIG. 3 is a diagram illustrating a state in which the carrier amplifier is on and the peak amplifier is off.

FIG. 3 is a diagram illustrating a state in which the carrier amplifier 111 is on and the peak amplifier 112 is off, that is, a state within the area where the signal RFin is less than or equal to $V_{BACK}$. In this case, the peak amplifier 112 is off and therefore, the impedance on the output side of the peak amplifier 112 is ideally open. As described below, the capacitor C5 and the inductor L6 can be omitted. Thus, given that the impedance on the load side (the matching network 121 side) viewed from the combiner 142 is $2R_L$, the impedance on the load side viewed from the output of the inductor L3 is also $2R_L$. Therefore, the impedance on the load side viewed from the output of the carrier amplifier 111 is given by $2R_L+j\omega\times(2R_L/\omega)=2R_L+j\times 2R_L$.

Figure 4:
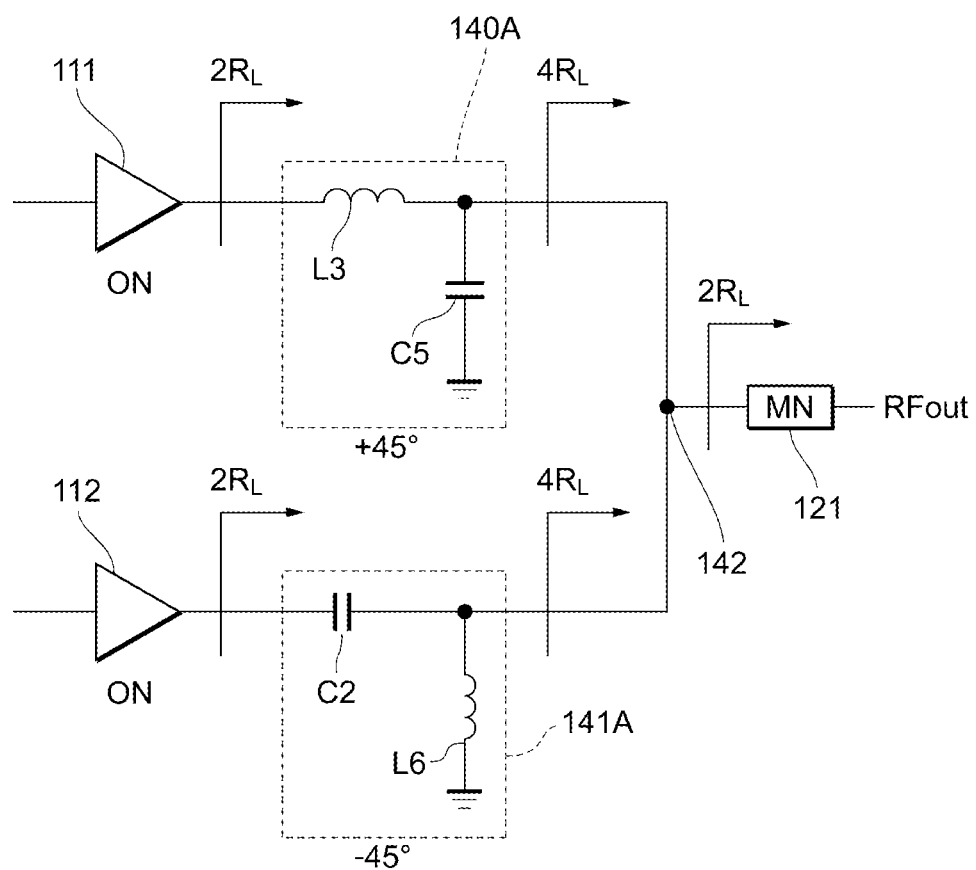

FIG. 4 is a diagram illustrating a state in which both the carrier amplifier 111 and the peak amplifier 112 are on and in which the currents thereof are equal, that is, a state in which the signal RFin is $V_{MAX}$. In this case, the peak amplifier 112 is on and the same current as that of the carrier amplifier 111 flows through the peak amplifier 112. Thus, given that the impedance on the load side (the matching network 121 side) viewed from the combiner 142 is $2R_L$, the impedance on the load side viewed from the output of the phase shifter 140A and the impedance on the load side viewed from the output of the phase shifter 141A are both $4R_L$, into which the impedance $2R_L$ on the load side is split. That is, since the phase shifter 140A and the phase shifter 141A are parallel-connected, in order to make the combined impedance of the phase shifter 140A and the phase shifter 141A match the impedance $2R_L$ on the load side, the combined impedance needs to be made equal to impedance $4R_L$, which is twice the impedance $2R_L$ on the load side. In this state, the phase shifter 140A delays the phase by 45 degrees and performs impedance conversion between the impedance ($2R_L$) on the load side viewed from the output of the carrier amplifier 111 and the impedance ($4R_L$) on the load side viewed from the output of the phase shifter 140A. Further, the phase shifter 141A advances the phase by 45 degrees and performs impedance conversion between the impedance ($2R_L$) on the load side viewed from the output of the peak amplifier 112 and the impedance ($4R_L$) on the load side viewed from the output of the phase shifter 141A. In the following, the principle of phase conversion and impedance conversion will be described.

Figure 5:
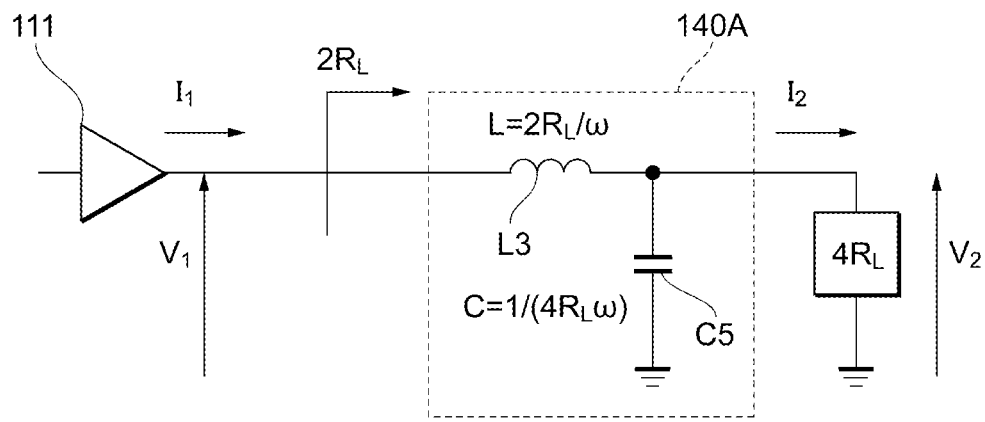
FIG. 5 is a diagram illustrating a path on the carrier amplifier side in the state illustrated in FIG. 4.

FIG. 5 is a diagram illustrating the path on the carrier amplifier 111 side in the state illustrated in FIG. 4. It is assumed here that the voltage and current on the input side of the phase shifter 140A are represented by $V_1$ and $I_1$, respectively, and the voltage and current on the output side of the phase shifter 140A are represented by $V_2$ and $I_2$, respectively. Since the impedance on the load side viewed from the output of the phase shifter 140A is $4R_L$, the current $I_2$ is expressed by the following equation.

$$I_2 = \frac{V_2}{4R_L} \qquad \text{[Math. 1]}$$

Further, the current $I_1$ is expressed by the following equation.

$$I_1 = I_2 + \frac{V_2}{\dfrac{1}{j\omega \dfrac{1}{4R_L\omega}}} = \frac{V_2}{4R_L}(1+j) = (1+j)I_2 \qquad \text{[Math. 2]}$$

Then, the voltage $V_1$ is expressed by the following equation.

$$V_1 = V_2 + I_1 j\omega \frac{2R_L}{\omega} = V_2 + \frac{j-1}{2}V_2 = \frac{1+j}{2}V_2 \qquad \text{[Math. 3]}$$

From the equation given above, it is seen that the voltage $V_2$ has a phase that is delayed by 45 degrees with respect to that of the voltage $V_1$.

Further, the impedance on the load side viewed from the output of the carrier amplifier 111 is expressed by the following equation.

$$\frac{V_1}{I_1} = \frac{\dfrac{1+j}{2}V_2}{(1+j)I_2} = \frac{1}{2} \cdot \frac{V_2}{I_2} = \frac{1}{2} \cdot 4R_L = 2R_L \qquad \text{[Math. 4]}$$

From the equation given above, it is seen that the impedance on the load side viewed from the output of the carrier amplifier 111 is $2R_L$.

Figure 6:
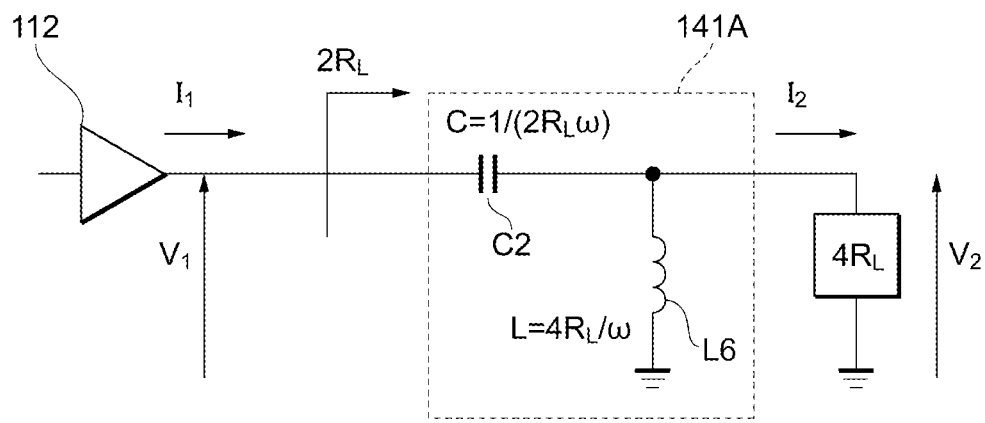
FIG. 6 is a diagram illustrating a path on the peak amplifier side in the state illustrated in FIG. 4.

FIG. 6 is a diagram illustrating the path on the peak amplifier 112 side in the state illustrated in FIG. 4. It is assumed here that the voltage and current on the input side of the phase shifter 141A are represented by $V_1$ and $I_1$, respectively, and the voltage and current on the output side of the phase shifter 141A are represented by $V_2$ and $I_2$, respectively. Since the impedance on the load side viewed from the output of the phase shifter 141A is $4R_L$, the current $I_2$ is expressed by the following equation.

$$I_2 = \frac{V_2}{4R_L} \qquad \text{[Math. 5]}$$

Further, the current $I_1$ is expressed by the following equation.

$$I_1 = I_2 + \frac{V_2}{j\omega \dfrac{4R_L}{\omega}} = \frac{V_2}{4R_L}(1-j) = (1-j)I_2 \qquad \text{[Math. 6]}$$

Then, the voltage $V_1$ is expressed by the following equation.

$$V_1 = V_2 + I_1 \frac{1}{j\omega \frac{1}{2R_L\omega}} = V_2 - \frac{j+1}{2}V_2 = \frac{1-j}{2}V_2 \quad [\text{Math. 7}]$$

From the equation given above, it is seen that the voltage $V_2$ has a phase that is advanced by 45 degrees with respect to that of the voltage $V_1$.

Further, the impedance on the load side viewed from the output of the peak amplifier 112 is expressed by the following equation.

$$\frac{V_1}{I_1} = \frac{\frac{1-j}{2}V_2}{(1-j)I_2} = \frac{1}{2} \cdot \frac{V_2}{I_2} = \frac{1}{2} \cdot 4R_L = 2R_L \quad [\text{Math. 8}]$$

From the equation given above, it is seen that the impedance on the load side viewed from the output of the peak amplifier 112 is $2R_L$.

According to the power amplifier 100 having the configuration described above, only the carrier amplifier 111 operates within an area where the power level of the signal RFin is comparatively low (for example, within an area where the power level is less than 6 dB back-off). On the other hand, both the carrier amplifier 111 and the peak amplifier 112 operate within an area where the power level of the signal RFin is comparatively high (for example, within an area where the power level is greater than or equal to 6 dB back-off).

Next, it will be explained that the capacitor C5 of the phase shifter 140A and the inductor L6 of the phase shifter 141A can be omitted (the phase shifters 140 and 141).

Figure 7:
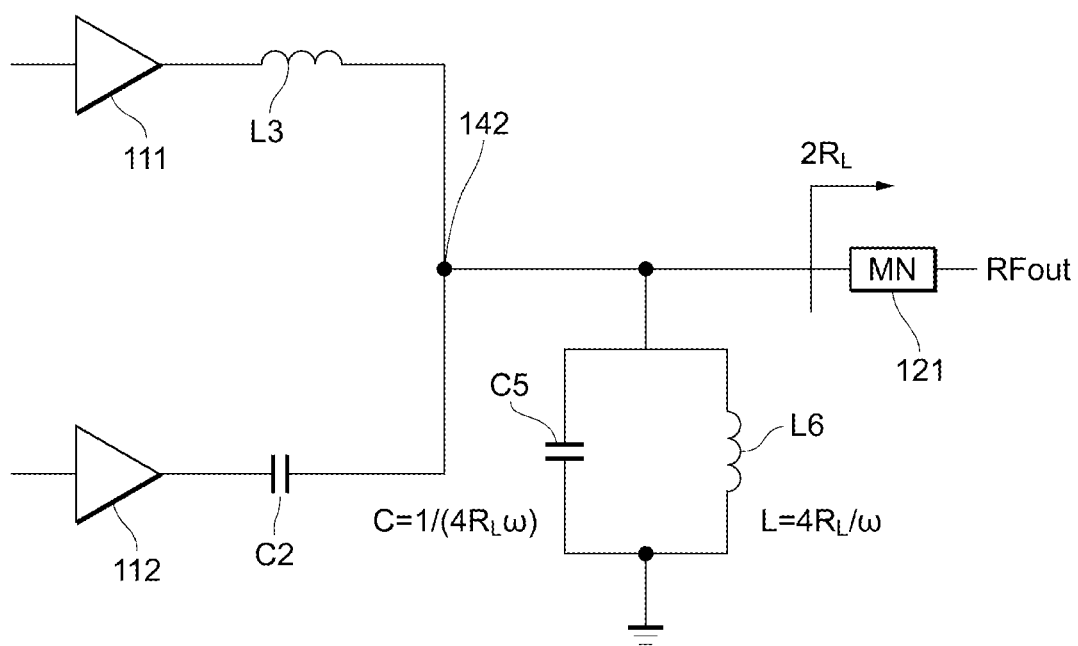
FIG. 7 is a diagram explaining that a grounded parallel circuit composed of a capacitor and an inductor can be omitted.

As illustrated in FIG. 7, the capacitor C5 and the inductor L6 can be regarded as a parallel circuit having an end connected to the combiner 142 and another end grounded. The combined impedance $Z_{LC}$ of the capacitor C5 and the inductor L6 is expressed by the following equation.

$$Z_{LC} = \frac{j\omega L \cdot \frac{1}{j\omega C}}{j\omega L + \frac{1}{j\omega C}} = \quad [\text{Math. 9}]$$

$$\frac{j\omega \frac{4R_L}{\omega} \cdot \frac{1}{j\omega \frac{1}{4R_L\omega}}}{j\omega \frac{4R_L}{\omega} + \frac{1}{j\omega \frac{1}{4R_L\omega}}} = \frac{j4R_L \cdot \frac{4R_L}{j}}{j4R_L + \frac{4R_L}{j}} = \frac{16R_L^2}{4R_L(j-j)} = \infty$$

As in the equation given above, the respective impedances of the capacitor C5 and the inductor L6 are set to predetermined impedances, thereby making the combined impedance of the capacitor C5 and the inductor L6 infinite. Thus, the capacitor C5 and the inductor L6 can be omitted.

Next, the operation of the LC parallel resonant circuits 150 and 151 will be described with reference to FIG. 1 and FIG. 8.

Figure 8:
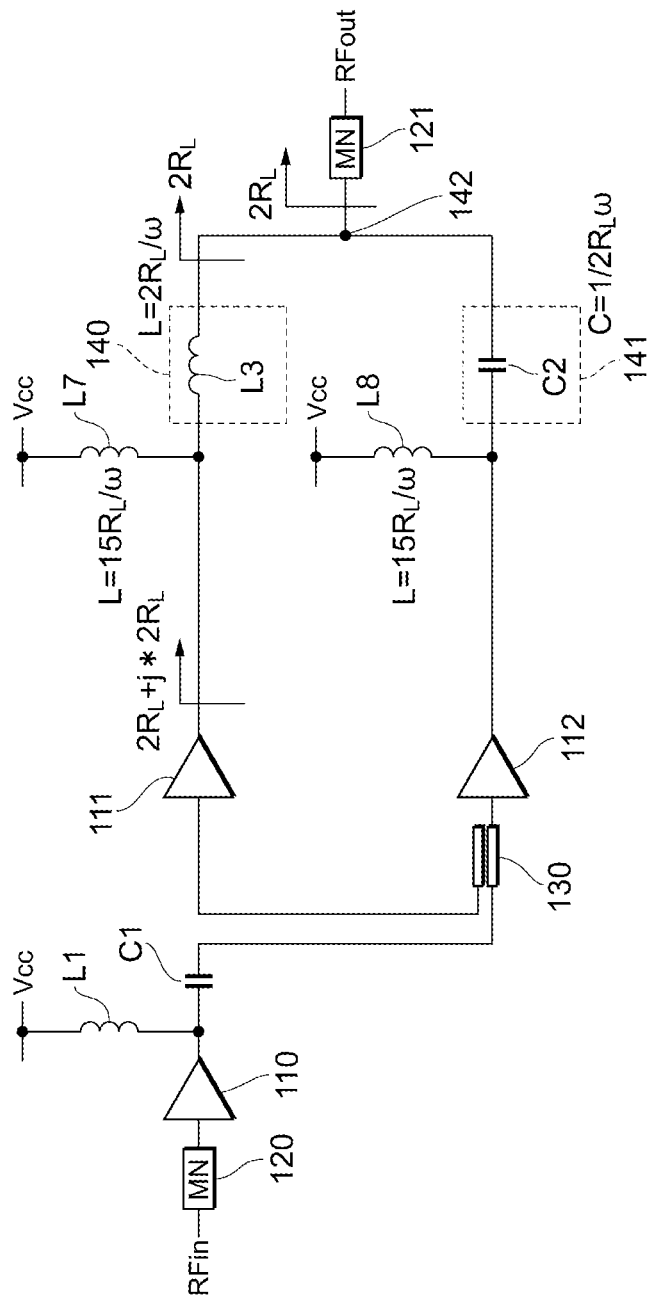
FIG. 8 is a diagram illustrating a comparative example of the power amplifier 100 according to the embodiment of the present disclosure.

FIG. 8 is a diagram illustrating a comparative example of the configuration of the power amplifier 100. In the comparative example, inductors L7 and L8 are included in place of the LC parallel resonant circuits 150 and 151 and the inductor L2 in the power amplifier 100.

The inductor L7 has an end to which the power supply voltage Vcc is supplied and another end connected to the output terminal of the carrier amplifier 111. The inductor L8 has an end to which the power supply voltage Vcc is supplied and another end connected to the output terminal of the peak amplifier 112. In the comparative example, the carrier amplifier 111 and the peak amplifier 112 do not share a power line and the inductors L7 and L8 function as choke inductors for the respective amplifiers.

In this embodiment, in contrast, as illustrated in FIG. 1, a single inductor L2 functions as a choke inductor for the carrier amplifier 111 and the peak amplifier 112. Thus, the number of choke inductors can be reduced by one compared with the comparative example illustrated in FIG. 8.

When the output terminals of the carrier amplifier 111 and the peak amplifier 112 are connected, the output signal of one amplifier may leak to the path of the other amplifier (cross talk), which can affect the output signal of the other amplifier. In this embodiment, however, the LC parallel resonant circuits 150 and 151 whose resonant frequencies are approximately M times (M: natural number) and approximately N times (N: natural number) the frequency of the signal RFin are included, which can suppress the cross talk. An LC parallel resonant circuit has its highest impedance at the resonant frequency. The LC parallel resonant circuits 150 and 151 are designed to have resonant frequencies that are approximately M times and approximately N times the frequency of the signal RFin, thereby being capable of preventing the approximately M-th harmonic and the approximately N-th harmonic of the amplified signal from passing.

In this embodiment, as an example, the resonant frequency of the LC parallel resonant circuit 150 on the carrier amplifier 111 side is set to 3 fo, which is 3 times a frequency fo of the signal RFin, and the resonant frequency of the LC parallel resonant circuit 151 on the peak amplifier 112 side is set to 1 fo, which is once the frequency fo of the signal RFin. This prevents the signals of the first harmonic (fundamental frequency) and third harmonic of the amplified signal, which are output from the carrier amplifier 111 and the peak amplifier 112, from passing through the LC parallel resonant circuits 150 and 151, thus suppressing the cross talk described above. It is to be noted that the allocation of the resonant frequencies of the LC parallel resonant circuits 150 and 151 are not limited to those described above. For example, the resonant frequency of the LC parallel resonant circuit 150 on the carrier amplifier 111 side may be set to 1 fo, and the resonant frequency of the LC parallel resonant circuit 151 on the peak amplifier 112 side may be set to 3 fo. In addition, the combination of resonant frequencies of two LC parallel resonant circuits is not limited to the combination of resonant frequencies that are 3 times and once. For example, the resonant frequency of the LC parallel resonant circuit 150 may be determined by multiplying fo by 4, and the resonant frequency of the LC parallel resonant circuit 151 may be determined by multiplying fo by 1. Alternatively, the resonant frequency of the LC parallel resonant circuit 150 may be determined by multiplying fo by 5, and the resonant frequency of the LC parallel resonant circuit 151 may be determined by multiplying fo by 1. In addition, the number of LC parallel resonant circuits is not limited to two and may be three or more.

With the configuration described above, in this embodiment, the size of inductors included in the power amplifier 100 can be reduced compared with inductors in the comparative example. This point will be described with reference to a specific example.

In the comparative example illustrated in FIG. 8, in a state in which the carrier amplifier 111 is on and the peak amplifier 112 is off, the impedance on the load side (load impedance) viewed from the output of the carrier amplifier 111 is given by $2R_L+j\times 2R_L$ (see FIG. 3). A choke inductor is typically required to have an inductance that is about 5 times the load impedance. That is, the inductors L7 and L8 are each required to have an inductance that meets $L>10\sqrt{2}R_L/\omega$. In this comparative example, the inductances of the inductors L7 and L8 are set to $L=15R_L/\omega$. Thus, the sum of the inductances of the inductors L7 and L8 is given by $15R_L/\omega+15R_L/\omega=30R_L/\omega$.

In this embodiment, in contrast, the power line of the carrier amplifier 111 and the peak amplifier 112 is provided with the LC parallel resonant circuits 150 and 151. Thus, before a high-frequency amplified signal is supplied to the inductor L2, the fundamental frequency and third harmonic of the amplified signal can be prevented from passing. The inductance of the inductor L2 can therefore be lower than a typical value (for example, about 5 times the load impedance). For example, the inductance of the inductor L2 can be set to $L=5R_L/\omega$. Further, the inductances of the inductors L4 and L5 are both $L=R_L/\omega$. Thus, the sum of the inductances of the inductors L2, L4, and L5 is given by $5R_L/O)+R_L/a)+R_L/a)=7R_L/\omega$. That is, as compared with the comparative example illustrated in FIG. 8, the inductance can be reduced by about $30R_L/W-7R_L/\omega=23R_L/\omega$.

With the configuration described above, unlike a typical Doherty amplifier, the power amplifier 100 need not include a λ/4-wave length line. In addition, since the inductance of the choke inductor is reduced, the space occupied by the choke inductor can be reduced. Therefore, it is possible to provide a power amplifier that can be made compact with high efficiency.

The inductors L4 and L5 included in the LC parallel resonant circuits 150 and 151 can be designed to have substantially equal inductances. This makes the direct-current resistance in the power line substantially equal on the carrier amplifier 111 side and the peak amplifier 112 side and enables substantially the same voltages to be applied to the carrier amplifier 111 and the peak amplifier 112.

Figure 9:
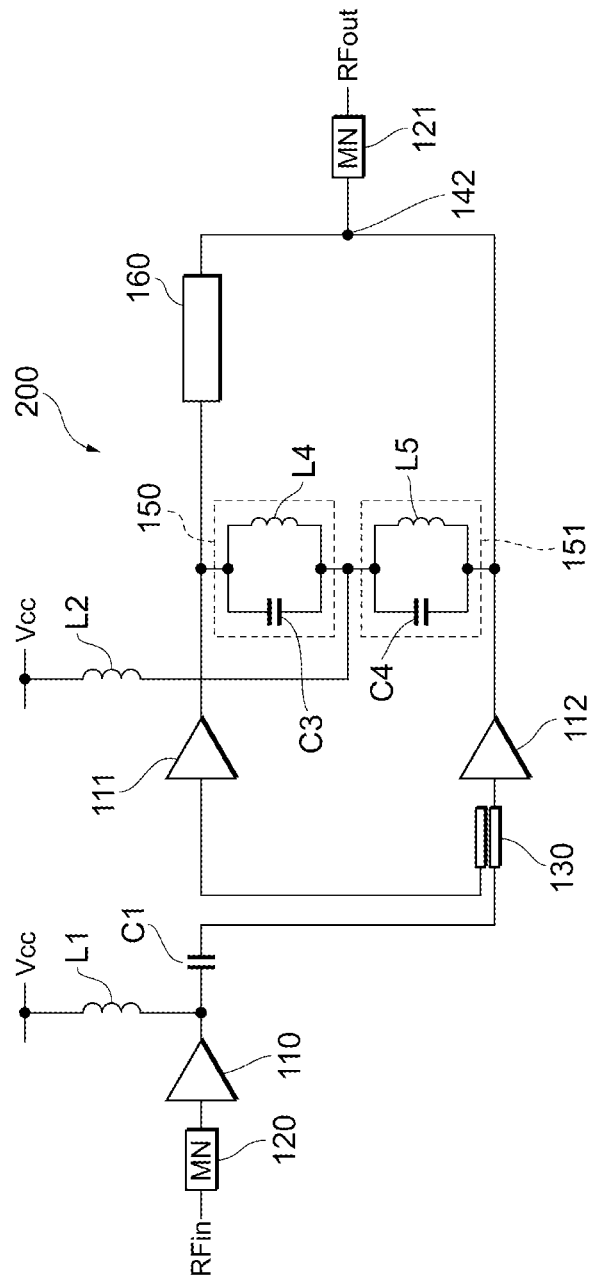
FIG. 9 is a diagram illustrating another example configuration of the power amplifier 100 according to the embodiment of the present disclosure.

FIG. 9 is a diagram illustrating another example of the configuration of the power amplifier 100 (power amplifier 200). The power amplifier 200 includes a λ/4-wave length line 160 instead of the phase shifters 140 and 141 included in the power amplifier 100.

The λ/4-wave length line 160 has an end connected to the output terminal of the carrier amplifier 111 and another end connected to the combiner 142. The λ/4-wave length line 160 and the combiner 142 constitute an output unit or circuit.

In this manner, the inductor L2 and the LC parallel resonant circuits 150 and 151 can be applied to a typical Doherty amplifier including the λ/4-wave length line 160. Accordingly, since the inductance of the choke inductor is reduced, the space occupied by the choke inductor can be reduced.

Figure 10A:
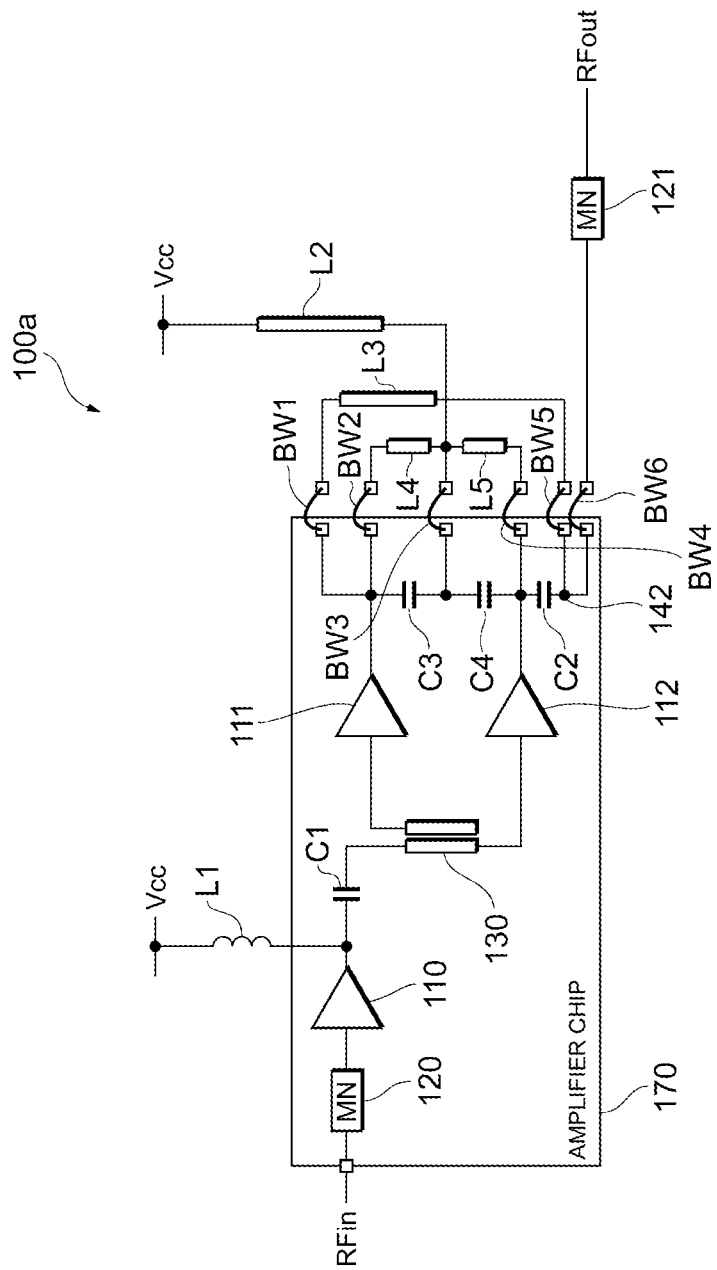
FIG. 10A is a diagram illustrating an overview of an example terminal arrangement in the power amplifier 100.

FIG. 10A is a diagram illustrating an overview of an example terminal arrangement in the power amplifier 100 (power amplifier 100a). As illustrated in FIG. 10A, the power amplifier 100a includes an amplifier chip 170 having the carrier amplifier 111, the peak amplifier 112, and so on.

In the power amplifier 100a, the inductor L2 (choke inductor), the inductor L3 included in the phase shifter 140, and the inductors L4 and L5 respectively included in the LC parallel resonant circuits 150 and 151, which are illustrated in FIG. 1, are disposed outside the amplifier chip 170 in the form of a wiring pattern. The inductors L2 to L5 are connected to terminals on the amplifier chip 170 via bonding wires BW1 to BW6. In this manner, the inductors L2 to L5 are formed as a wiring pattern, which can reduce the direct-current resistance value and ensure a high Q value.

In addition, the capacitor C2 included in the phase shifter 141 and the capacitors C3 and C4 respectively included in the LC parallel resonant circuits 150 and 151, which are illustrated in FIG. 1, are disposed on the amplifier chip 170 in the form of MIM (Metal-Insulator-Metal) capacitors. This can reduce parasitic inductance, compared with the case where the capacitors C2 to C4 are mounted outside the amplifier chip 170. Hence, unintended resonance caused by the parasitic inductance can be avoided, and deterioration in the characteristics of the power amplifier 100 can be suppressed.

Figure 10B:
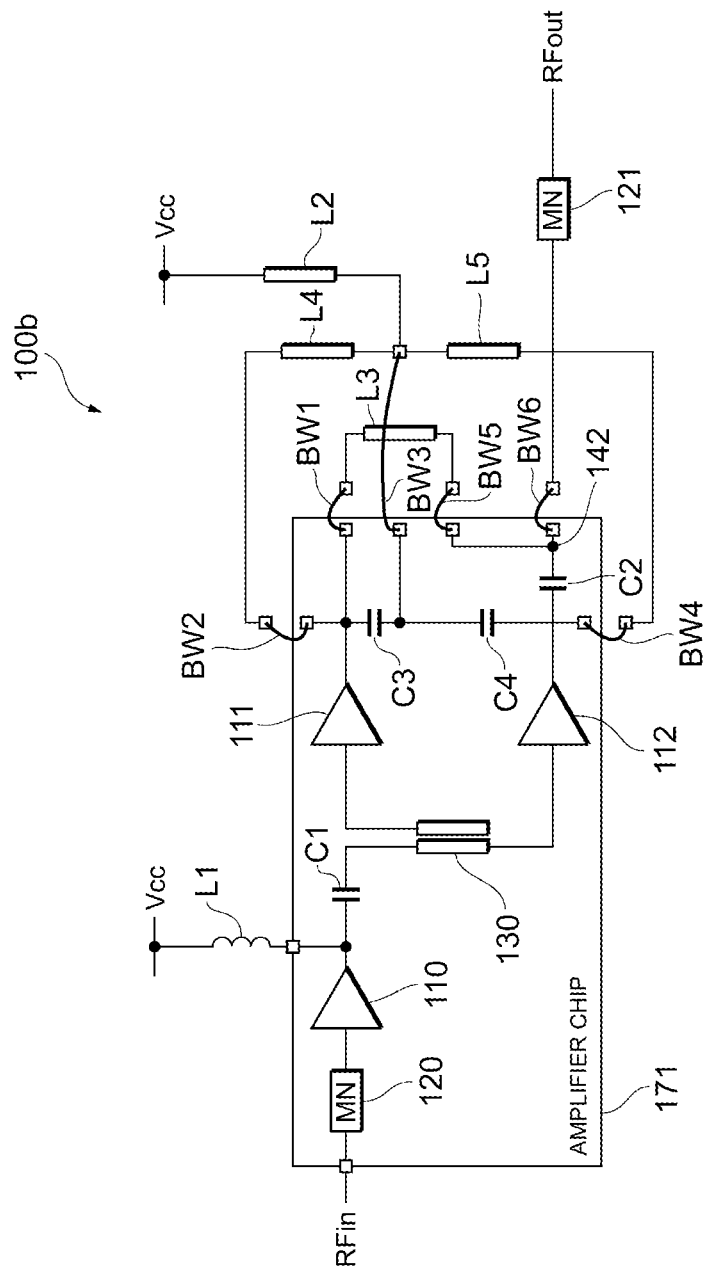
FIG. 10B is a diagram illustrating an overview of another example terminal arrangement in the power amplifier 100.

FIG. 10B is a diagram illustrating an overview of another example terminal arrangement in the power amplifier 100 (power amplifier 100b). The power amplifier 100b includes an amplifier chip 171 having the carrier amplifier 111, the peak amplifier 112, and so on.

Also, in the power amplifier 100b, as in the power amplifier 100a, the inductors L2 to L5 are disposed outside the amplifier chip 171 in the form of a wiring pattern. The capacitors C2 to C4 are disposed on the amplifier chip 171 in the form of MIM capacitors. In the power amplifier 100b, the positions of the terminals to which the bonding wires BW2 and BW4 are connected are different from those in the power amplifier 100a. Specifically, in FIG. 10B, the terminals to which the bonding wires BW1, BW3, BW5, and BW6 are connected are disposed on the right side of the amplifier chip 171, whereas the terminals to which the bonding wires BW2 and BW4 are connected are disposed on the upper and lower sides of the amplifier chip 171, respectively. This configuration can also achieve advantages similar to those of the power amplifier 100a.

The terminal arrangements illustrated in FIG. 10A and FIG. 10B are examples, and the terminal arrangement of the power amplifier 100 is not limited to these examples.

In the power amplifiers 100a and 100b, furthermore, all of the inductors L2 to L5 are implemented as a wiring pattern, and all of the capacitors C2 to C4 are implemented as MIM capacitors. However, the configurations of the inductors and capacitors are not limited to those described above. For example, some of the inductors or capacitors may have a configuration other than a wiring pattern or a MIM capacitor.

In FIG. 10A and FIG. 10B, furthermore, bonding wires are depicted one by one. However, the number of bonding wires is not limited to that illustrated in the drawings and may be modified, as appropriate, in accordance with the design.

In addition, the inductors disposed outside the amplifier chip may be mounted by using flip-chip technology instead of wire bonding and may be implemented as chip inductors.

The terminal arrangements of the power amplifiers 100a and 100b illustrated in FIG. 10A and FIG. 10B can also be applied to the power amplifier 200.

Next, simulation results of gain characteristics and power-added efficiency for the power amplifier 100 will be described with reference to FIG. 11A to FIG. 13B.

Figure 11A:
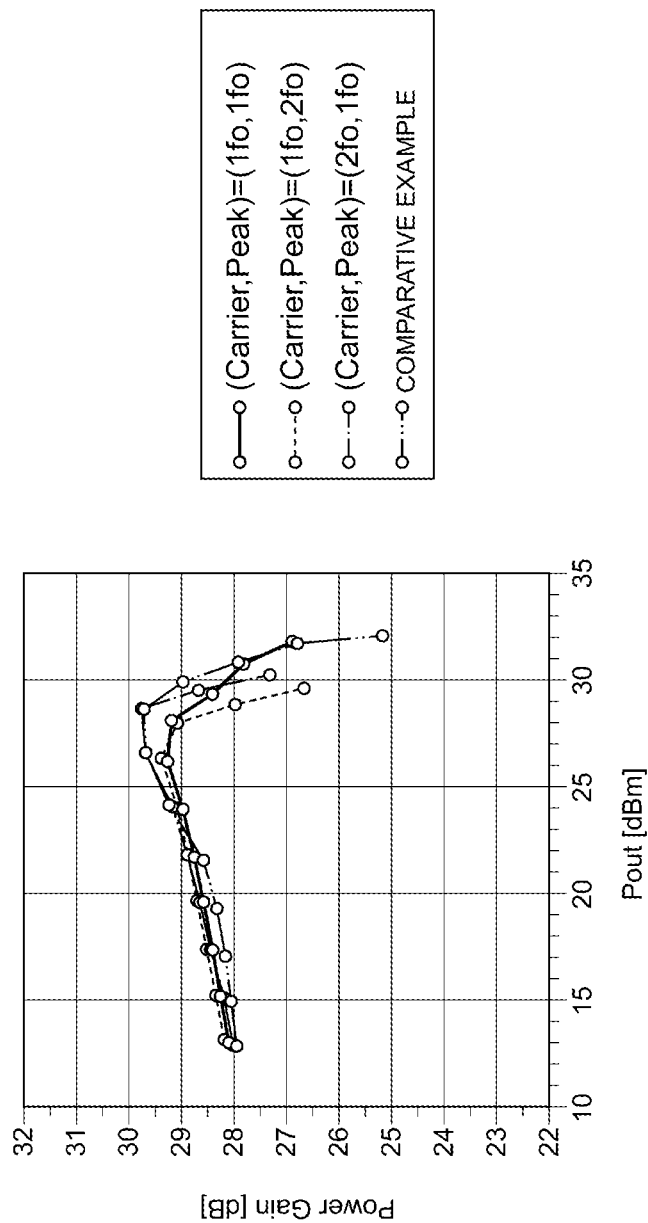
FIG. 11A is a diagram illustrating an example of simulation results of gain characteristics for the power amplifier 100.
Figure 11B:
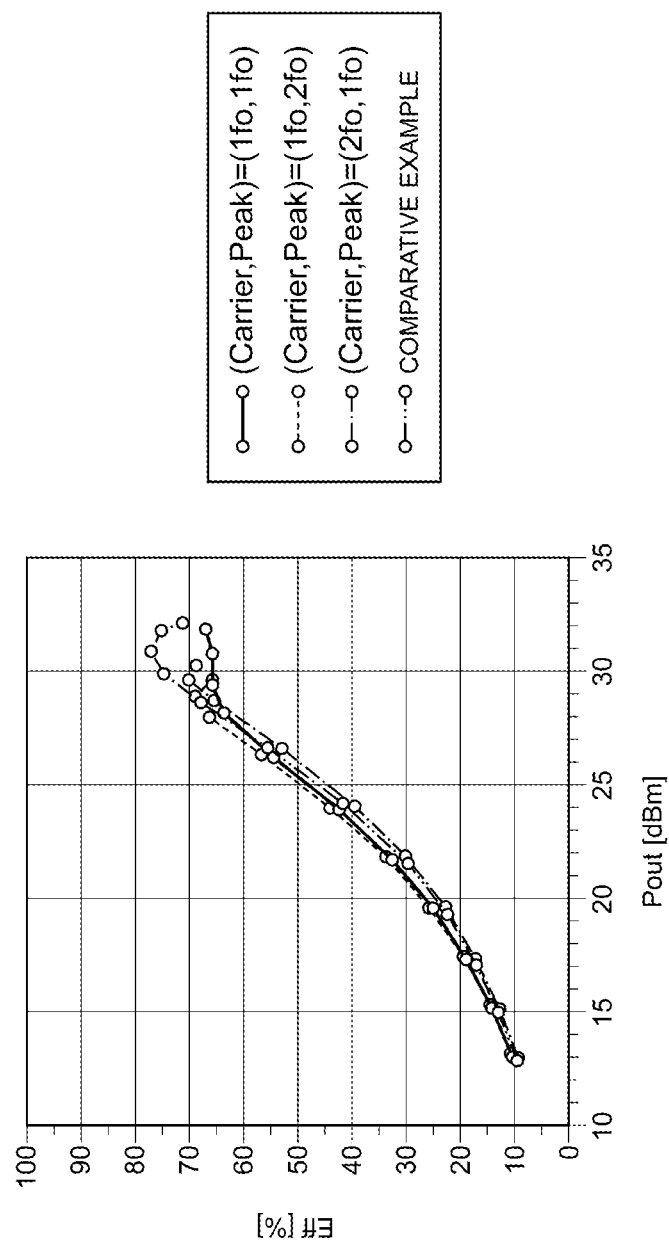
FIG. 11B is a diagram illustrating an example of simulation results of power-added efficiency for the power amplifier 100.
Figure 12A:
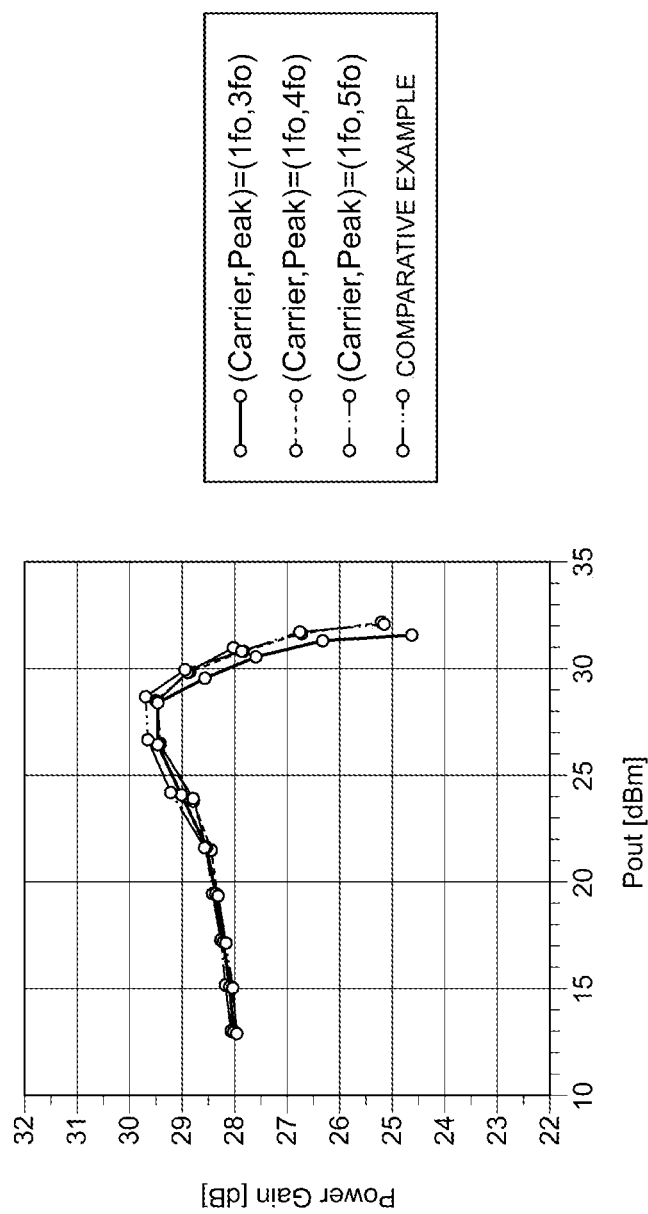
FIG. 12A is a diagram illustrating an example of simulation results of gain characteristics for the power amplifier 100.
Figure 12B:
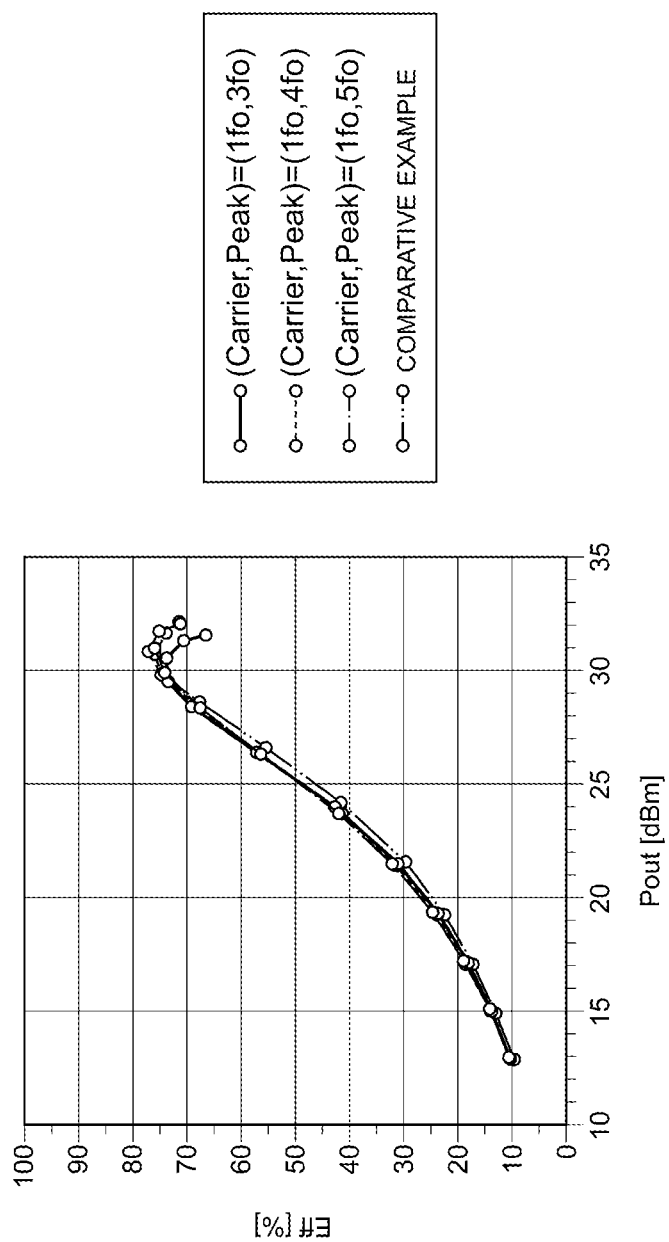
FIG. 12B is a diagram illustrating an example of simulation results of power-added efficiency for the power amplifier 100.
Figure 13A:
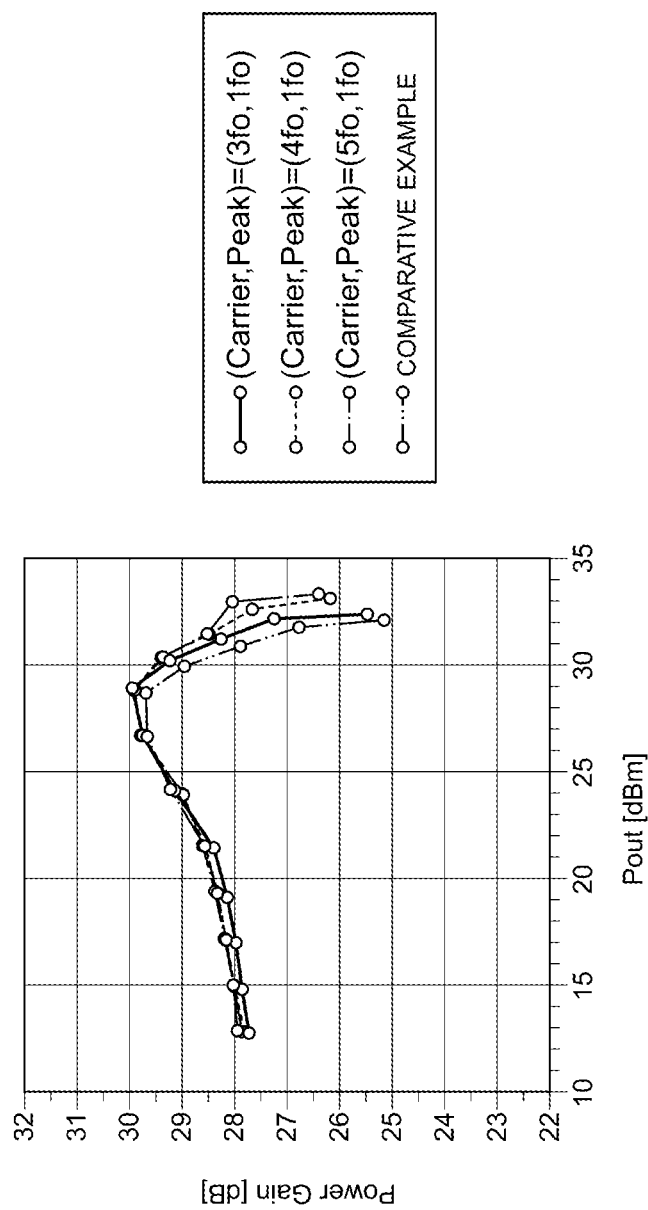
FIG. 13A is a diagram illustrating an example of simulation results of gain characteristics for the power amplifier 100.
Figure 13B:
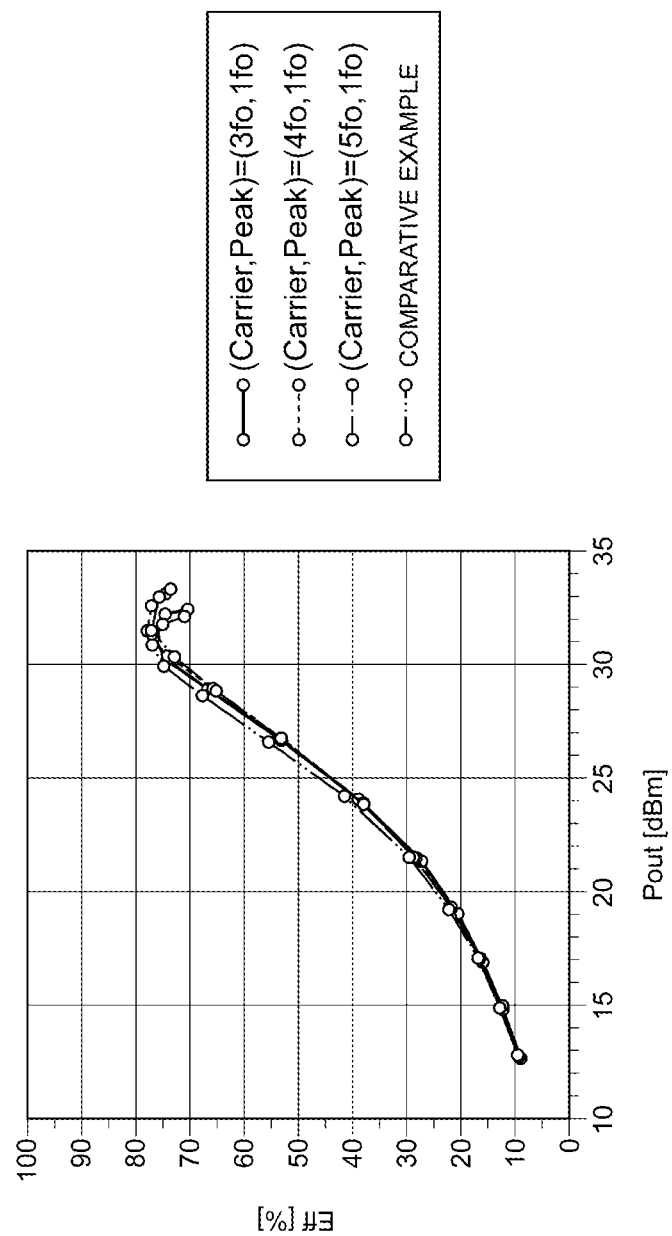
FIG. 13B is a diagram illustrating an example of simulation results of power-added efficiency for the power amplifier 100.

FIG. 11A, FIG. 12A, and FIG. 13A are graphs illustrating simulation results of gain characteristics for the power amplifier 100 and the comparative example illustrated in FIG. 8. In the graphs illustrated in FIG. 11A, FIG. 12A, and FIG. 13A, the vertical axis represents gain (dB) and the horizontal axis represents output power (dBm). FIG. 11B, FIG. 12B, and FIG. 13B are graphs illustrating simulation results of power-added efficiency for the power amplifier 100 and the comparative example illustrated in FIG. 8. In the graphs illustrated in FIG. 11B, FIG. 12B, and FIG. 13B, the vertical axis represents power-added efficiency (%) and the horizontal axis represents output power (dBm).

In FIG. 11A and FIG. 11B, each of the resonant frequencies of the LC parallel resonant circuit 150 (the carrier amplifier 111 side) and the LC parallel resonant circuit 151 (the peak amplifier 112 side) of the power amplifier 100 is set to the first harmonic (1 fo) or second harmonic (2 fo) of the frequency of an input signal. In FIG. 12A and FIG. 12B, the resonant frequency of the LC parallel resonant circuit 150 is set to the first harmonic (1 fo) alone, and the resonant frequency of the LC parallel resonant circuit 151 is set to the third harmonic (3 fo), the fourth harmonic (4 fo), and the fifth harmonic (5 fo). In FIG. 13A and FIG. 13B, the resonant frequency of the LC parallel resonant circuit 150 is set to the third harmonic (3 fo), the fourth harmonic (4 fo), and the fifth harmonic (5 fo), and the resonant frequency of the LC parallel resonant circuit 151 is set to the first harmonic (1 fo) alone.

As illustrated in FIG. 11A, FIG. 12A, and FIG. 13A, regardless of which frequency (1 fo to 5 fo) the resonant frequencies of the LC parallel resonant circuits 150 and 151 are set to, the gain characteristics are not substantially different from those in the comparative example until the gain starts to decrease at an output power exceeding about 27 dBm. As illustrated in FIG. 11B, FIG. 12B, and FIG. 13B, the power-added efficiency is also not substantially different from that in the comparative example until the output power exceeds about 29 dBm, regardless of which frequency (1 fo to 5 fo) the resonant frequencies of the LC parallel resonant circuits 150 and 151 are set to. According to the simulation results, the gain characteristics are enhanced compared with the comparative example when the resonant frequency of the LC parallel resonant circuit 150 is set to the third harmonic, the fourth harmonic, or the fifth harmonic and the resonant frequency of the LC parallel resonant circuit 151 is set to the first harmonic (see FIG. 13A).

From the simulation results described above, it is seen that the power amplifier 100 maintains power-added efficiency compared with the comparative example with a reduced total number of choke inductors and reduced inductance, which leads to a reduction in the space occupied by the inductors. That is, the power amplifier 100 can achieve a reduction in the size of the power amplifier while maintaining high efficiency with the use of a Doherty amplifier.

Next, the effect of the parasitic inductance in the power amplifier 100 will be described with reference to FIG. 14A and FIG. 14B.

Figure 14A:
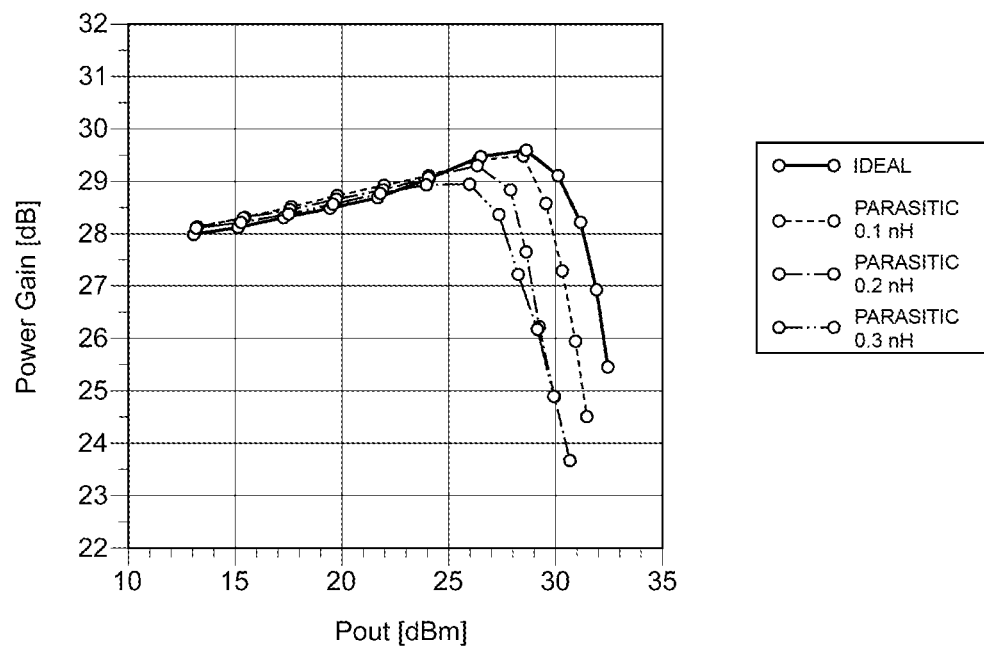
FIG. 14A is a diagram illustrating an example of simulation results of gain characteristics for the power amplifier 100.

FIG. 14A is a graph illustrating the effect of the parasitic inductance in the power amplifier 100 on the gain characteristics. In the graph illustrated in FIG. 14A, the vertical axis represents gain (dB) and the horizontal axis represents output power (dBm). FIG. 14B is a graph illustrating the effect of the parasitic inductance in the power amplifier 100 on the power-added efficiency. In the graph illustrated in FIG. 14B, the vertical axis represents power-added efficiency (%) and the horizontal axis represents output power (dBm). FIG. 14A and FIG. 14B illustrate simulation results when the parasitic inductance of the capacitor C2 in the power amplifier 100 is given by L=0.0 nH (ideal state), 0.1 nH, 0.2 nH, and 0.3 nH.

Figure 14B:
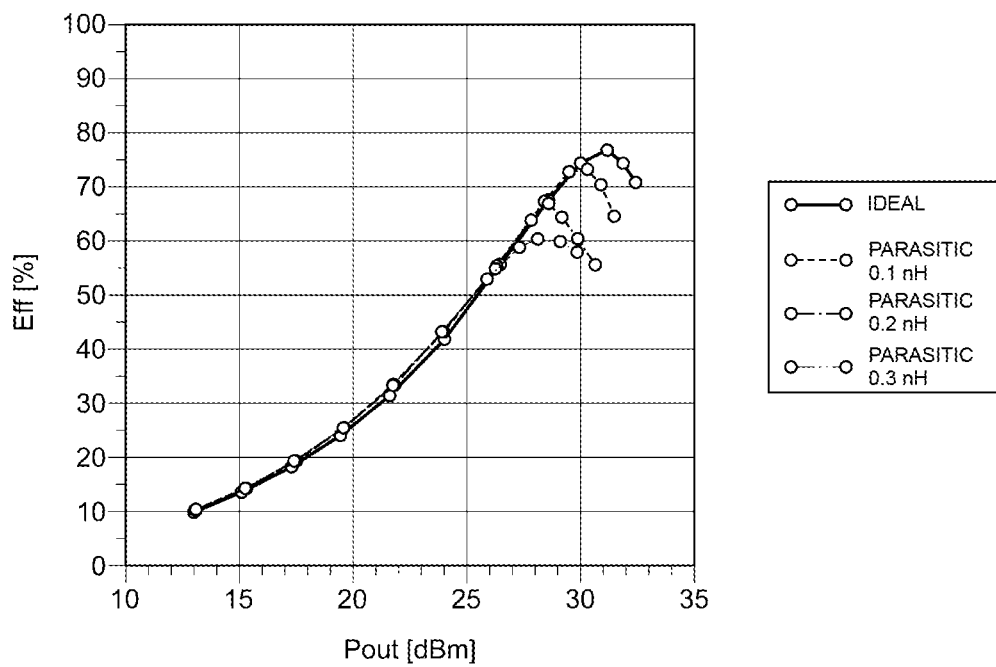
FIG. 14B is a diagram illustrating an example of simulation results of power-added efficiency for the power amplifier 100.

As illustrated in FIG. 14A and FIG. 14B, it is seen that as the amount of parasitic inductance increases, the gain characteristics and the power-added efficiency deteriorate, compared with the ideal state. From the simulation results described above, it is seen that, in the power amplifiers 100a and 100b illustrated in FIG. 10A and FIG. 10B, the capacitor C2 is implemented as a MIM capacitor to avoid the effect of parasitic inductance, thereby suppressing deterioration in the characteristics of the power amplifier 100.

An illustrative embodiment of the present disclosure has been described. In the power amplifiers 100 and 200, the carrier amplifier 111 and the peak amplifier 112 in the configuration of a typical Doherty amplifier share a single inductor L2 (choke inductor), and the LC parallel resonant circuits 150 and 151 whose resonant frequencies are approximately an integer multiple of the frequency of an input signal are provided between the output terminals of the respective amplifiers and the inductor L2. A Doherty amplifier is used in this manner, which can reduce the total number of choke inductors and the inductance, which leads to a reduction in the space occupied by the choke inductors, while achieving enhanced efficiency of the power amplifier. Therefore, it is possible to provide a power amplifier that can be made compact with high efficiency.

In addition, the resonant frequency of each LC parallel resonant circuit can be set to approximately once, approximately 3 times, approximately 4 times, or approximately 5 times the frequency of an input signal. In particular, the resonant frequency of the LC parallel resonant circuit 150 on the carrier amplifier 111 side can be set to approximately 3 times, approximately 4 times, or approximately 5 times, and the resonant frequency of the LC parallel resonant circuit 151 on the peak amplifier 112 side can be set to approximately once. The configurations of the LC parallel resonant circuits are not limited to those described above.

In addition, the inductors L4 and L5 included in the LC parallel resonant circuits 150 and 151 can be designed to have substantially equal inductances. This makes the direct-current resistance in the power line substantially equal on the carrier amplifier 111 side and the peak amplifier 112 side and enables substantially the same voltages to be applied to the carrier amplifier 111 and the peak amplifier 112.

In addition, the power amplifier 100 includes, instead of a λ/4-wave length line, the phase shifter 140 that outputs a signal that is delayed by approximately 45 degrees of phase with respect to an output signal of the carrier amplifier 111, and the phase shifter 141 that outputs a signal that is advanced by approximately 45 degrees of phase with respect to the peak amplifier 112. Thus, it is possible to provide a high-efficiency power amplifier without necessarily using a λ/4-wave length line. Therefore, further size reduction can be achieved, compared with the power amplifier 200.

In addition, in the power amplifiers 100 and 200, at least one of the inductor L4 included in the LC parallel resonant circuit 150, the inductor L5 included in the LC parallel resonant circuit 151, the inductor L2 (choke inductor), or the inductor L3 may be implemented by using a wiring pattern and may be connected to a chip having the carrier amplifier 111 and the peak amplifier 112 by using wire-bonding. This can reduce the direct-current resistance value and ensure a high Q value.

In the power amplifiers 100 and 200, additionally, at least one of the capacitor C3 included in the LC parallel resonant circuit 150, the capacitor C4 included in the LC parallel resonant circuit 151, or the capacitor C2 may be implemented as a MIM capacitor on a chip having the carrier amplifier 111 and the peak amplifier 112. This can avoid unintended resonance caused by the parasitic inductance of a capacitor and suppress deterioration in the characteristics of a power amplifier.

Each embodiment described above is intended to help easily understand the present disclosure and is not to be used to construe the present disclosure in a limiting fashion. The present disclosure may be modified/improved without departing from the gist thereof, and its equivalents are also included in the present disclosure. That is, each embodiment may be appropriately modified in design by those skilled in the art, and such a modification also falls within the scope of the present disclosure so long as the modification includes the features of the present disclosure. For example, the elements included in each embodiment and the arrangement, materials, conditions, shapes, sizes, and so on thereof are not limited to those illustrated by way of example but can be modified as appropriate. Furthermore, it goes without saying that each embodiment is illustrative and partial replacement or combination of configurations given in different embodiments can be made. Such replacement or combination also falls within the scope of the present disclosure so long as the replacement or combination includes the features of the present disclosure.

REFERENCE SIGNS LIST 100, 100a, 100b, 200 power amplifier
110 initial-stage amplifier
111 carrier amplifier
112 peak amplifier
120, 121 matching network
130 3-dB coupler
140, 140A, 141, 141A phase shifter
142 combiner
150, 151 LC parallel resonant circuit
160 λ/4-wave length line
170, 171 amplifier chip
L1, L2, L3, L4, L5, L6, L7, L8 inductor
C1, C2, C3, C4, C5 capacitor

The invention claimed is:

1. A power amplifier comprising:
a power splitter configured to split a first signal into a second signal and a third signal, the third signal being delayed with respect to the second signal;
a first amplifier configured to amplify the second signal when the first signal has a power level greater than or equal to a first level, and configured to output a fourth signal;
a second amplifier configured to amplify the third signal when the first signal has a power level greater than or equal to a second level, and configured to output a fifth signal, wherein the second level is greater than the first level;
an output circuit configured to output an amplified signal of the first signal based on the fourth and fifth signals;
first and a second LC parallel resonant circuits connected in series between an output terminal of the first amplifier and an output terminal of the second amplifier; and
a choke inductor having a first end to which a power supply voltage is supplied and a second end connected to a node between the first and second LC parallel resonant circuits, wherein:
the first LC parallel resonant circuit has a resonant frequency that is approximately an integer multiple of a frequency of the first signal, and
the second LC parallel resonant circuit has a resonant frequency that is approximately an integer multiple of the frequency of the first signal.

2. The power amplifier according to claim 1, wherein:
the resonant frequency of the first LC parallel resonant circuit is approximately three times the frequency of the first signal, and
the resonant frequency of the second LC parallel resonant circuit is approximately the frequency of the first signal.

3. The power amplifier according to claim 1, wherein:
the resonant frequency of the first LC parallel resonant circuit is approximately four or five times the frequency of the first signal, and
the resonant frequency of the second LC parallel resonant circuit is approximately the frequency of the first signal.

4. The power amplifier according to claim 2, wherein:
the fourth signal is supplied to a first end of the first LC parallel resonant circuit, and
the fifth signal is supplied to a first end of the second LC parallel resonant circuit.

5. The power amplifier according to claim 3, wherein:
the fourth signal is supplied to a first end of the first LC parallel resonant circuit, and
the fifth signal is supplied to a first end of the second LC parallel resonant circuit.

6. The power amplifier according to claim 1, wherein the first and second LC parallel resonant circuits comprise inductors having substantially equal inductances.

7. The power amplifier according to claim 1, wherein the output circuit comprises:
a first phase shifter configured to receive the fourth signal and to output a sixth signal that is delayed with respect to the fourth signal,
a second phase shifter configured to receive the fifth signal and to output a seventh signal that is advanced with respect to the fifth signal, and
a combiner configured to combine the sixth signal and the seventh signal, and to output the amplified signal of the first signal.

8. The power amplifier according to claim 1, further comprising:
a series inductor connected in series with the output terminal of the first amplifier,
wherein an inductor included in the first LC parallel resonant circuit, an inductor included in the second LC parallel resonant circuit, the choke inductor, or the series inductor is connected, via wire-bonding, to a chip comprising the first and second amplifiers.

9. The power amplifier according to claim 1, further comprising:
a series capacitor connected in series with the output terminal of the second amplifier,
wherein a capacitor included in the first LC parallel resonant circuit, a capacitor included in the second LC parallel resonant circuit, or the series capacitor is constituted by a metal-insulator metal (MIM) capacitor on a chip comprising the first and second amplifiers.

10. The power amplifier according to claim 8, further comprising:
a series capacitor connected in series with the output terminal of the second amplifier,
wherein a capacitor included in the first LC parallel resonant circuit, a capacitor included in the second LC parallel resonant circuit, or the series capacitor is constituted by a metal-insulator metal (MIM) capacitor on the chip comprising the first and second amplifiers.

11. The power amplifier according to claim 8, wherein:
the inductor included in the first LC parallel resonant circuit or the inductor included in the second LC parallel resonant circuit is connected, via wire-bonding, to a first side of the chip comprising the first and second amplifiers, the choke inductor or the series inductor is connected, via wire-bonding, to a second side of the chip comprising the first and second amplifiers, and the first side is adjacent to the second side.

\* \* \* \* \*

UNITED STATES PATENT AND TRADEMARK OFFICE
CERTIFICATE OF CORRECTION

PATENT NO.       : 11,309,844 B2
APPLICATION NO.  : 16/931965
DATED            : April 19, 2022
INVENTOR(S)      : Takenaka It is certified that error appears in the above-identified patent and that said Letters Patent is hereby corrected as shown below:

In the Specification

Column 9, Lines 24-25, "$5R_L/O)+R_L/a)+R_L/a)=7R_L/\omega$" should be -- $5R_L/\omega + R_L/\omega + R_L/\omega = 7R_L/\omega$ --.

Column 9, Line 27, "$30R_L/W - 7R_L/\omega=23R_L/\omega$" should be -- $30R_L/\omega - 7R_L/\omega = 23R_L/\omega$ --.

Signed and Sealed this
Seventh Day of February, 2023

Katherine Kelly Vidal
*Director of the United States Patent and Trademark Office*